United States Patent [19]

Calligaro et al.

[11] Patent Number: 5,729,490
[45] Date of Patent: Mar. 17, 1998

[54] PARALLEL-DICHOTOMIC SERIAL SENSING METHOD FOR SENSING MULTIPLE-LEVEL NON-VOLATILE MEMORY CELLS, AND SENSING CIRCUIT FOR ACTUATING SUCH METHOD

[75] Inventors: Cristiano Calligaro, Torre D'Isola; Vincenzo Daniele, Brugherio; Roberto Gastaldi, Agrate Brianza; Alessandro Manstretta, Broni; Nicola Telecco, Monleale; Guido Torelli, S. Alessio Con Vialone, all of Italy

[73] Assignee: SGS-Thomson Microelectronics S.r.l., Agrate Brianza, Italy

[21] Appl. No.: 690,059

[22] Filed: Jul. 31, 1996

[30] Foreign Application Priority Data

Jul. 31, 1995  [EP]  European Pat. Off. .......... 95830347

[51] Int. Cl.$^6$ ............................................. G11C 7/00
[52] U.S. Cl. ......................... 365/185.03; 365/185.2; 365/185.21; 365/189.07; 365/210
[58] Field of Search .................... 365/185.03, 185.2, 365/185.21, 207, 210, 189.07

[56] References Cited

U.S. PATENT DOCUMENTS

| | | | |
|---|---|---|---|
| 4,544,917 | 10/1985 | Lenhoff, Jr. .......................... | 340/347 |
| 4,749,984 | 6/1988 | Prost et al. ........................... | 340/347 |
| 4,964,079 | 10/1990 | Devin .................................. | 365/185.03 |
| 5,019,820 | 5/1991 | Matsuzawa et al. ................. | 341/156 |
| 5,070,332 | 12/1991 | Kaller et al. ........................ | 341/156 |
| 5,142,495 | 8/1992 | Canepa ............................... | 365/185.2 |
| 5,163,021 | 11/1992 | Mehrotra et al. ................... | 365/185.03 |
| 5,381,374 | 1/1995 | Shiraishi et al. ..................... | 365/185.2 |
| 5,638,322 | 6/1997 | Lacey .................................. | 365/185.21 |

FOREIGN PATENT DOCUMENTS

| | | | |
|---|---|---|---|
| 0 057 111 | 8/1982 | European Pat. Off. ......... | G11C 17/00 |

OTHER PUBLICATIONS

Bleiker, Christoph et al., "A Four-State EEPROM Using Floating-Gate Memory Cells," IEEE Journal of Solid-State Circuits, vol. SC-22, No. 3, Jun. 1987, pp. 460–463.

Horiguchi, Masashi et al, "An Experimental Large-Capacity Semiconductor File Memory Using 16-Levels/Cell Storage," IEEE Journal of Solid-State Circuits, vol. 23, No. 1, Feb. 1988, pp. 27–32.

Bauer, M., et al., "A Multilevel Cell 32MB Flash Memory," IEEE International Solid-State Circuits Conference, Feb. 16, 1995, pp. 119, 132–133, 351.

Primary Examiner—Son T. Dinh
Attorney, Agent, or Firm—David V. Carlson; Bryan A. Santarelli; Seed and Berry LLP

[57] ABSTRACT

A method for sensing multiple-levels non-volatile memory cells which can take one programming level among a plurality of m=2$^n$ (n>=Z) different programming levels, provides for biasing a memory cell to be sensed in a predetermined condition, so that the memory cell sinks a cell current with a value belonging to a discrete set of m distinct cell current values, each cell current value corresponding to one of said programming levels. The sensing method also provides for: simultaneously comparing the cell current with a prescribed number of reference currents having values comprised between a minimum value and a maximum value of said discrete set of m cell current values and dividing said discrete set of m cell current values in a plurality of sub-sets of cell current values, for determining the sub-set of cell current values to which the cell current belongs; repeating step (a) for the sub-set of cell current values to which the cell current belongs, until the sub-set of cell current values to which the cell current belongs comprises only one cell current value, which is the value of the current of the memory cell to be sensed.

18 Claims, 5 Drawing Sheets

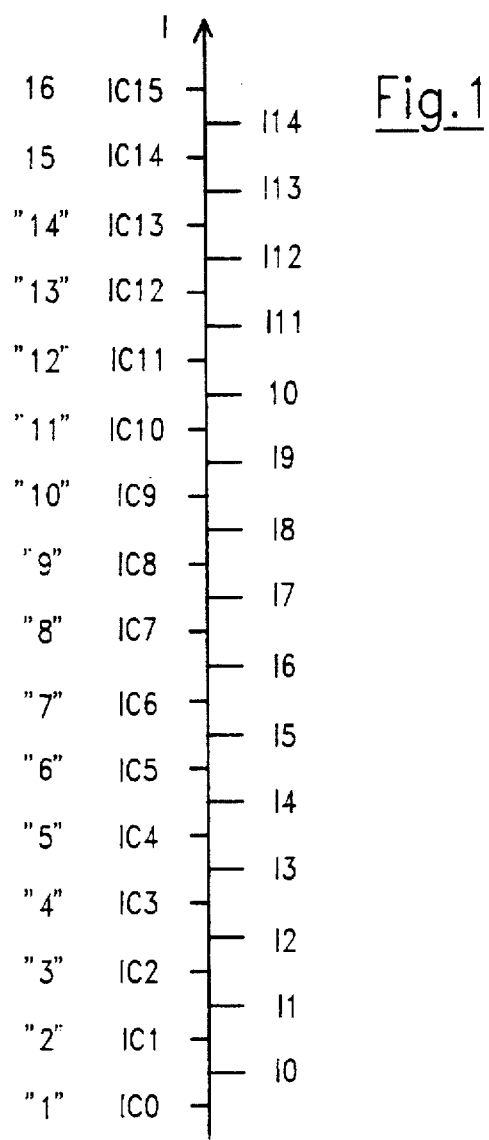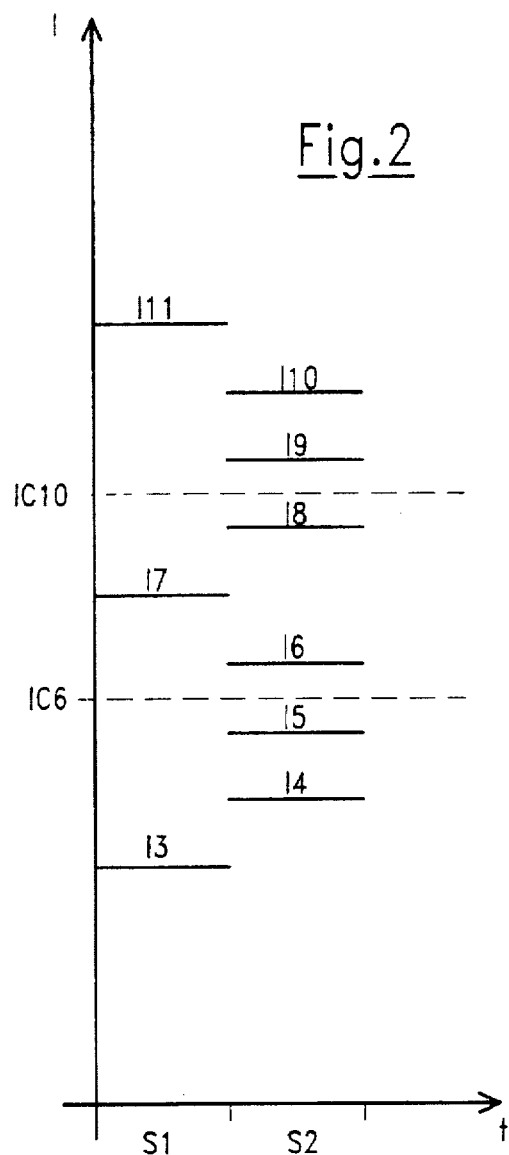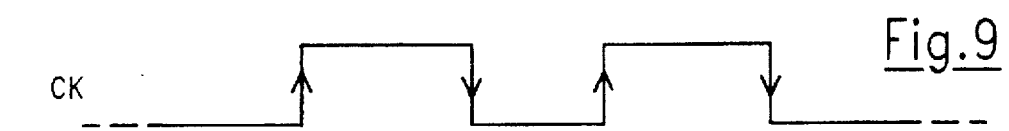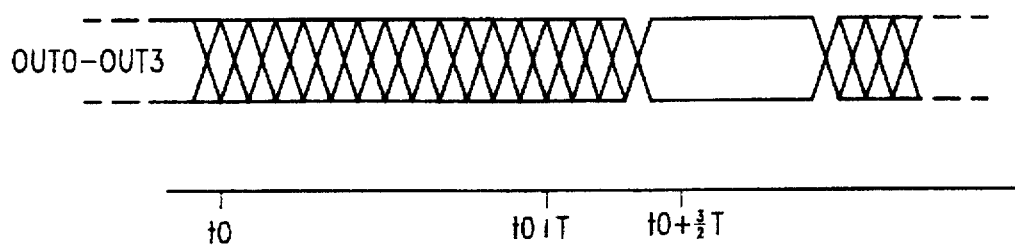

| S3 S2 S1 | tn<br>Q4 Q3 Q2 Q1 Q0 | tn+1<br>Q4 Q3 Q2 Q1 Q0 | O3 O2 O1 O0 |
|---|---|---|---|
| 000 | 00001 | 00010 | XXXX |
| 001 | 00001 | 00100 | XXXX |
| 011 | 00001 | 01000 | XXXX |
| 111 | 00001 | 10000 | XXXX |
| 000 | 00010 | 00001 | 0000 |
| 001 | 00010 | 00001 | 0001 |
| 011 | 00010 | 00001 | 0010 |
| 111 | 00010 | 00001 | 0011 |
| 000 | 00100 | 00001 | 0100 |
| 001 | 00100 | 00001 | 0101 |
| 011 | 00100 | 00001 | 0110 |
| 111 | 00100 | 00001 | 0111 |
| 000 | 01000 | 00001 | 1000 |
| 001 | 01000 | 00001 | 1001 |
| 011 | 01000 | 00001 | 1010 |
| 111 | 01000 | 00001 | 1011 |
| 000 | 10000 | 00001 | 1100 |
| 001 | 10000 | 00001 | 1101 |
| 011 | 10000 | 00001 | 1110 |
| 111 | 10000 | 00001 | 1111 |

Fig.7

PARALLEL-DICHOTOMIC SERIAL SENSING METHOD FOR SENSING MULTIPLE-LEVEL NON-VOLATILE MEMORY CELLS, AND SENSING CIRCUIT FOR ACTUATING SUCH METHOD

TECHNICAL FIELD

The present invention relates to a mixed parallel-dichotomic serial sensing method for sensing multiple-level non-volatile memory cells, and to a sensing actuating such method.

BACKGROUND OF THE INVENTION

The market demand for non-volatile memories with higher and higher storage capacity is forcing the semiconductor manufacturers to a continuous effort in scaling down the devices and in increasing the chip size.

As an additional possibility to increase the memories' capacities, it has been proposed to store more than one bit per memory cell. A memory device with memory cells capable of storing two or even four bits has a storage capacity two or, respectively, four times higher than that of a memory device with the same chip size but with memory cells capable of storing only one bit each.

Non-volatile memory cells are generally represented by MOS field effect transistors. Data can be programmed in non-volatile memory cells by changing the threshold voltage of the MOS field effect transistors. In the case of ROMs, this is done during their fabrication, while in the case of EPROMs, EEPROMs and Flash EEPROMs, the change in the threshold voltage is achieved by properly biasing the MOS field effect transistors to cause an injection of charges in a floating gate.

To determine the programming state of a non-volatile memory cell, i.e., to "read" or to "sense" the memory cell content, a fixed voltage VG is applied to the control gate of the MOS transistor. The programming state of the memory cell can thus be determined by detecting the position of the threshold voltage of the MOS transistor with respect to said fixed gate voltage.

In the most common case of non-volatile memory cells capable of storing only one bit of information, a memory cell can show two different programming states (logic levels), corresponding to two different threshold voltage values In the following description, such a cell will be called a "two-level memory cell." The sensing of the memory cells is performed by a so-called "sensing circuit," which delivers a voltage signal having two distinct possible values corresponding to the two logic levels.

In the case of non-volatile memory cells capable of storing more than one bit of information, a memory cell must be able to show $m=2^n$ distinct programming states or levels, where n represents the number of bits which can be stored in the memory cell. In the following description, such a cell will be called a "multiple-level memory cell." As in the case of two-level cells, each level corresponds to a different value for the threshold voltage of the MOS transistor. The m different values for the threshold voltage are chosen inside the allowed threshold voltage range (i.e., the difference between the maximum and the minimum values for the threshold voltage) according to the sensing technique and to the physical parameters of the memory cells.

Two sensing techniques have been proposed for multiple-level memory cells: parallel-mode sensing and serial-mode sensing.

Parallel-mode sensing is described in A. Bleiker, H. Melchior, "A Four-State EEPROM Using Floating-Gate Memory Cells," IEEE Journal of Solid State Circuits, Vol. SC-22, No. 3, July 1987, pp. 460–463. This technique provides for generating m distinct predetermined voltage or current references, and for performing m simultaneous comparisons of such m distinct voltage or a current derived from the memory cell to be read.

The advantages of the parallel-mode sensing technique are its high speed and the independence of the sensing time from the programming state of the memory cell. A disadvantage is the large area required by the sensing circuit, since m distinct comparison circuits are necessary to perform the m simultaneous comparisons.

Differently from parallel-mode sensing, serial-mode sensing requires just one reference (current or voltage), which can be varied according to a prescribed law. This single reference used to perform a series of successive comparisons, and is varied to approximate the analogic current or voltage derived from the memory cell to be read. Serial-mode sensing may be implemented with simple circuitry, and the area required by the sensing circuitry is little.

Two different kinds of serial-mode sensing methodologies are known, which differ in the law according to which the reference is made to vary.

The first methodology, also called "sequential," described for example in M. Horiguchi et al., "An Experimental Large-Capacity Semiconductor File Memory Using 16-Levels/Cell Storage," IEEE Journal of Solid State Circuits, Vol. SC-23, No. 1, February 1988, pp. 27–32, consists in a succession of comparisons (at most m−1) between a fixed quantity (voltage or current) and a variable quantity (voltage or current) which sequentially varied starting from an initial value.

For example, the fixed quantity can be the current sunk by the memory cell to be read (biased in a prescribed biasing condition), while the variable quantity can be a current supplied by a digitally-driven generator. The (constant) current sunk by the memory cell to be read is compared with a reference current which takes successively increasing (or decreasing) discrete values starting from a minimum (or maximum) value. The discrete values are ideally chosen in such a way as to fall between the different current values corresponding to the m programming levels of the memory cell, so that the result of a comparison is negative (or positive) as long as the reference current is lower (or higher) than the cell's current. The series of successive comparisons stops after the first positive (or negative) result. The last value of the reference current represents the current of the memory cell, except for a constant term associated with the position of the reference current value relative to the programming levels of the memory cell.

It appears that the time required to read a memory cell with the sequential serial method is not uniform, but depends on the particular programming level of the memory cell and on the starting value for the reference voltage or current. That is, the sensing time depends on the distance between the programming level of the cell to be read and the starting value of the reference voltage or current. From a minimum of one to a maximum of m−1 comparison steps can be necessary to determine the programming state of an m-level memory cell. The sensing time soon becomes excessive with the increase of the number of bits stored in a single memory cell.

The second serial-mode sensing methodology, also called "dichotomic," is described in copending European Application No. 95830023.8 filed on Jan. 27, 1995, and corresponding U.S. patent application Ser. No. 08/593,650 filed Jan. 29, 1996, which are incorporated by reference herein. A related methodology is recited in European Patent Application No. 95830010.3 filed Mar. 23, 1995, and corresponding U.S. patent application Ser. No. 08/592,939 filed Jan. 29, 1996, which are also incorporated by reference herein. This methodology consists of a successive approximations search that, starting from an initial value for the reference current, finds the value of the memory cell current after a succession of iterations. At each step of the iterative search, the (constant) memory cell current is compared with the variable reference current, whose value is chosen according to a dichotomic or "binary search" algorithm. The initial interval of possible memory cell current values is divided in two parts. Depending on the result of the comparison, the successive dichotomy will be applied to only that part of the initial interval wherein the memory cell current falls. The iterative search is recursively repeated until the value of the memory cell current is determined.

Using the dichotomic serial method, the programming state of a memory cell with $m=2^n$ different programming levels is determined in n comparison steps, independently from the particular programming state of the memory cell. For example, in the case of a memory cell with $m=16$ different programming levels, the programming state of the memory cell is determined in 4 comparison steps.

The dichotomic serial method is better, from the sensing time viewpoint, than the sequential serial method, even if the serial method requires only one comparison circuit. The sensing time is, however, significantly longer than that obtainable using the parallel-mode sensing method, especially when the number of different programming levels of the memory cells is greater than four, that is, for memory cells with sixteen or more programming levels.

SUMMARY OF THE INVENTION

In view of the state of the prior art described, it is an object of the present invention to provide a method for sensing multiple-level non-volatile memory cells constituting a better trade-off between reduced sensing time requirements and small occupation of silicon area.

Another object of the present invention is to provide a circuit for sensing multiple-level memory cells actuating such a method.

According to the present invention, a method is provided for sensing multiple-level non-volatile memory cells which can take one programming level among a plurality of $m=2^n$ ($n>=2$) different programming levels, providing for biasing a memory cell to be sensed in a predetermined condition, so that the memory cell sinks a cell current with a value belonging to a discrete set of m distinct cell current values, each cell current value corresponding to one of said programming levels, characterized by further providing for:

(a) simultaneously comparing the cell current with a prescribed number of reference currents having values comprised between a minimum value and a maximum value of said discrete set of m cell current values and dividing said discrete set of m cell current values in a plurality of sub-sets of cell current values, and determining the sub-set of cell current values to which the cell current belongs;

(b) repeating step (a) for the sub-set of cell current values to which the cell current belongs, until the sub-set of cell current values to which the cell current belongs comprises only one cell current value, which is the value of the current of the memory cell to be sensed.

The method of the present invention mixes the dichotomic serial sensing method and the parallel sensing method. The sensing of a memory cell is carried out in successive steps. In each step, a parallel sensing of the memory cell is performed, simultaneously comparing the current of the memory to be sensed with a plurality of reference currents. The reference current values are chosen in such a way as to divide the initial set of m cell current values in a plurality of sub-sets. The parallel sensing of the memory cell allows one to determine to which of the sub-sets of memory cell currents the cell current belongs. Then the method is iterated performing a parallel sensing of the memory cell in only the sub-set of memory cell currents to which the cell current belongs. The cell current is again simultaneously compared with a plurality of reference currents with values suitable to divide the sub-set into further sub-sets, to determine to which of said further sub-sets the cell current belongs. The sensing of the memory cell is completed when the sub-set to which the cell current belongs contains only one memory cell current value.

Preferably, the reference current values in each step of the sensing method are chosen in such a way that the sub-sets of memory cell current values contain an equal number of discrete values.

As in the dichotomic serial sensing method, the sensing time is constant and does not depend on the programming state of the memory cell to be sensed. However, the sensing of a memory cell requires fewer steps than those required by the dichotomic serial sensing method.

Also according to the present invention, a circuit is provided for sensing multiple-level non-volatile memory cells which can take one programming level among a plurality of $m=2^n$ ($n>=2$) different programming levels, comprising biasing means for biasing a memory cell to be sensed in a predetermined condition, so that the memory cell sinks a cell current with a value belonging to a discrete set of m distinct cell current values, each cell current value corresponding to one of said programming levels, characterized in that it comprises a plurality of current comparators for simultaneously comparing the cell current with a plurality of reference currents generated by a plurality of variable reference current generators, and in that it further comprises a sequential machine supplied with output signals of said plurality of current comparators and controlling the variable reference current generator, the sequential machine comprising a sequential network which, starting from a predetermined initial state causing the reference current generators to generate a plurality of reference currents with value comprised between a minimum value and a maximum value of said discrete set of cell current values and dividing said discrete set of m cell current values in a plurality of subsets of cell current values, evolves through a succession of states each one determined by the preceding state and by the logic state of said output signals of the current comparators, each state of the sequential network causing the reference current generators to generate reference currents with values comprised between a minimum value and a maximum value of the sub-set of cell current values to which the cell current belongs and further dividing said sub-set of cell current values into a plurality of sub-sets of cell current values.

BRIEF DESCRIPTION OF THE DRAWINGS

The features and advantages of the present invention will be made more evident by the following detailed description of one particular embodiment, described as a non-limiting example with reference to the annexed drawings, wherein:

FIG. 1 diagrammatically shows the distribution of currents sunk by a sixteen-level memory cell in its sixteen different programming conditions, and the distribution of reference currents used to sense the memory cell according to the method of the present invention;

FIG. 2 diagrammatically show the steps of the sensing method of the invention for two different programming conditions of the memory cell;

FIG. 7 is a truth table of the sequential machine of FIG. 6;

FIG. 9 is a time diagram of a clock signal and of output signals of the sequential machine of FIG. 6.

DETAILED DESCRIPTION OF THE INVENTION

The sensing method of the present invention will be described making reference to the particular case of a sixteen-level non-volatile memory cell, i.e., a memory cell capable of storing four bits of information. However, it should be understood that the method of the present invention is not limited to the sensing of a sixteen-level memory cell, being extendible in a straightforward way to the sensing of memory cells with a higher or fewer number of programming levels, i.e., memory cells capable of storing more or fewer than four bits of information. Also, it should be understood that the sensing method of the present invention can be applied to the sensing of ROM, EPROM, EEPROM or Flash EEPROM multiple-level memory cells.

Figure 3:
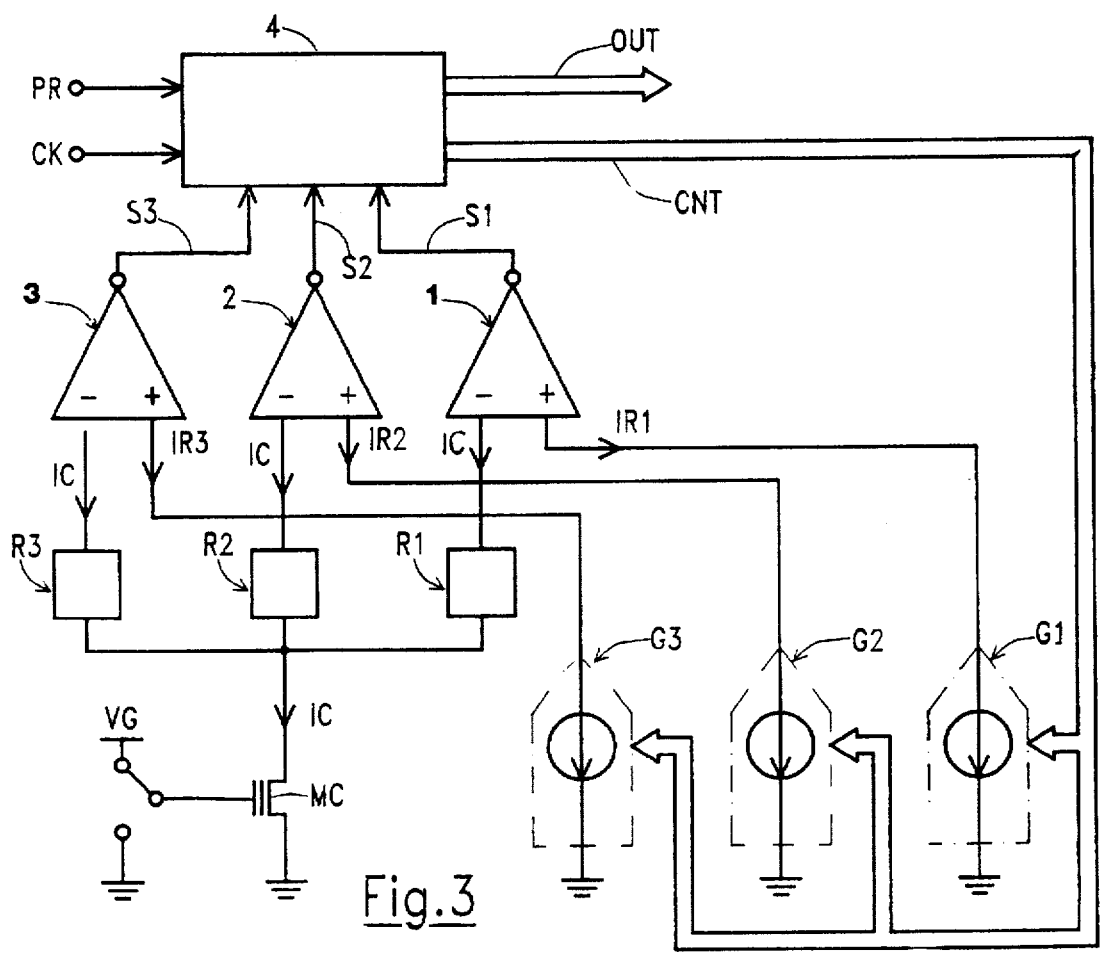
FIG. 3 schematically shows a circuit for sensing multiple-level non-volatile memory cells according to the present invention.

The memory cell to be sensed is biased in a predetermined biasing condition (see FIG. 3). In such a condition, the memory cell sinks a current IC whose value depends on the particular programming level of the memory cell itself, i.e., on the memory cell's threshold voltage. For example, in the particular case of an EPROM memory cell fabricated by means of a conventional CMOS EPROM manufacturing process, when the memory cell is biased with a control gate voltage of approximately 5 V and with a drain voltage of approximately 1 V (the source voltage is typically zero), the sixteen different values of the cell current IC (corresponding to the sixteen different programming levels of the memory cell) could be, for example, the following:

| Programming Level | Four-Bit Code |
| --- | --- |
| IC0 = 0 µA | 0000 |
| IC1 = 10 µA | 0001 |
| IC2 = 20 µA | 0010 |
| IC3 = 30 µA | 0011 |
| IC4 = 40 µA | 0100 |
| IC5 = 50 µA | 0101 |
| IC6 = 60 µA | 0110 |
| IC7 = 70 µA | 0111 |
| IC8 = 80 µA | 1000 |

-continued

| Programming Level | Four-Bit Code |
| --- | --- |
| IC9 = 90 µA | 1001 |
| IC10 = 100 µA | 1010 |
| IC11 = 110 µA | 1011 |
| IC12 = 120 µA | 1100 |
| IC13 = 130 µA | 1101 |
| IC14 = 140 µA | 1110 |
| IC15 = 150 µA | 1111 |

It is also assumed that fifteen reference current generators are available generating fifteen reference currents I0–I14 having the following values:

| | | | |
| --- | --- | --- | --- |
| I0 = 5 µA; | I1 = 15 µA | I2 = 25 µA; | I3 = 35 µA |
| I4 = 45 µA; | I5 = 55 µA | I6 = 65 µA; | I7 = 75 µA |
| I8 = 85 µA; | I9 = 95 µA | I10 = 105 µA; | I11 = 115 µA |
| I12 = 125 µA; | I13 = 135 µA | I14 = 145 µA; | |

Referring to FIG. 1, each reference current falls in the middle between two respective adjacent memory cell current values.

Referring to FIG. 2, as a first example, it is assumed that the programming state of the memory cell corresponds to a cell current equal to IC6 (60 µA).

In a first step of the sensing method, the cell current IC is simultaneously compared with a group of three different reference currents IR1, IR2 and IR3, for example, IR1=I3 (35 µA), IR2=I7 (75 µA) and IR3=I11 (115 µA). These three reference currents divide the range of the memory cell currents IC0–IC15 into four identical sub-sets, namely IC0–IC3, IC4–IC7, IC8–IC11 and IC12–IC15. In other words, the value of the reference currents is selected to define groups of current levels. Each group of memory cell currents contains a same number of different cell currents. Depending on the result of the three simultaneous comparisons, it is possible to determine the sub-set of cell currents to which the cell current IC belongs. In the present example, the three simultaneous comparisons tell that the cell current IC is higher than I3 but lower than I7 (and, obviously, lower than I11). The cell current IC must therefore belong to the sub-range IC4–IC7 of the memory cell currents IC0–IC15. It is worth noting that this sub-range of memory cell currents corresponds to four distinct programming conditions of the memory cell for which the two most significant bits (MSB) of the four-bit code stored in the memory cell are equal to 01. Thus, in the first step of the sensing method the two MSB of the four-bit code stored in the memory cell have been determined.

In a second step of the sensing method, the cell current IC is simultaneously compared with another group of three reference currents IR1, IR2 and IR3, namely IR1=I4 (45 µA), IR2=I5 (55 µA) and IR3=I6 (65 µA). The three simultaneous comparisons tell that the cell current IC is higher than I4, higher than I5 and lower than I6. It follows that the cell current must necessarily be equal to IC6. In the second step of the sensing method the two least significant bits (LSB) of the four-bit code stored in the memory cell are determined. In this step, the value of the reference currents are selected to have values intermediate the highest and lowest possible values of the new group. The new group is a sub-range, or a sub-group of the full group. The reference currents are selected to group the new current group into further equal-sized sub-groups. In this case, with three reference currents and four possible current levels, the sub-groups each contain one current level.

Thus, it has been possible to determine the programming level of the sixteen-level memory cell in only two steps.

Still referring to FIG. 2, as a second example, it is assumed that the programming state of the memory cell corresponds to a cell current IC equal to IC10 (100 µA).

In the first step of the sensing method, the cell current is simultaneously compared with the three reference currents IR1=I3, IR2=I7 and IR3=I11. Depending on the result of the three simultaneous comparisons, it is possible to determine the sub-range of cell currents to which the cell current belongs. In the present example, the three simultaneous comparisons tell that the cell current IC is higher than I3, higher than I7, but lower than I11. The cell current must therefore belong to the sub-range IC8–IC11 of the memory cell currents IC0–IC15. The most significant bits of the four-bit code stored in the memory cell are equal to 10.

In the second step of the sensing method, the cell current IC is simultaneously compared with the three reference currents IR1=I8 (85 µA), IR2=I9 (95 µA) and IR3=I10 (105 µA). The three simultaneous comparisons tell that the cell current IC is higher than I8, higher than I9 and lower than I10 It follows that the cell current IC must necessarily be equal to IC10.

Again it has been possible to determine the programming level of the sixteen-level memory cell in only two steps.

Therefore, according to the method of the present invention it is possible to sense a sixteen-level memory cell in only two steps, independently of the particular programming level of the memory cell. As previously mentioned, using a dichotomic serial sensing method, the programming state of a sixteen-level memory cell can be determined in four steps. Thus, the sensing method of the present invention is faster than the dichotomic serial sensing method.

The sensing method of the present invention can be extended to memory cells with more than sixteen programming levels. For example, in the case of a memory cell with 256 programming levels (a memory cell capable of storing 8 bits of information) the method of the present invention allows one to perform the sensing of the memory cell in $\log_4 m = 4$ steps, performing three simultaneous comparisons. In the first step, the range of 256 memory cell currents is divided by the three reference currents IR1, IR2 and IR3 in four sub-ranges, preferably containing a same number (64) of distinct cell current values. The three simultaneous comparisons of the cell current IC with the three reference currents IR1, IR2, IR3 determine to which of the four sub-ranges of cell current values the memory cell current IC belongs. Then three reference currents IR1, IR2, IR3 are chosen which divide the sub-range determined in the first step in four sub-ranges. Again, the three simultaneous comparisons of the cell current IC with the three reference currents IR1–IR3 allows one to determine to which of the four sub-ranges the cell current IC belongs. The process goes on recursively performing in each step a parallel sensing of the memory cell restricted to the sub-range of cell current values determined in the preceding step (successive approximation search). In each step, two bits of the eight-bit code stored in the memory cell are determined, starting from the two most significant bits. More generally, where a memory cell has $m=2^n$ distinct programming levels, wherein in each step of the sensing method k bits of the n-bit code stored in the memory cell are determined performing $2^k-1$ simultaneous comparisons, the number of steps to carry out the sensing of the memory cell is $\log_{(2^k)}(m)$. For example, in the case of a 256-level memory cell, it could be possible to determine in each step four bits (k=4) of the eight bit code stored in the memory cell, performing in each step fifteen simultaneous comparisons (2k–1=15). In this case, only two steps are necessary to sense a 256-levels memory cell, but at the expense of a higher number of comparators (fifteen instead of three).

In FIG. 3, a sensing circuit according to the present invention suitable for actuating the previously described sensing method is schematically shown. The circuit substantially comprises three digitally-driven variable reference current generators G1, G2, G3 (for example, three digital-to-analog converters with current-mode output) generating three variable reference currents IR1, IR2, IR3, three current comparators 1, 2, 3, three circuits R1, R2, R3 for replicating a current IC sunk by a multiple-level memory cell MC to be sensed, and a sequential machine 4 which controls the three variable reference current generators G1, G2, G3 and provides at its output the n-bit code stored in the memory cell MC. There are many well-known current-replicating and current-mirror circuits that are suitable for use as circuits R1–R3, and, therefore, detailed embodiments of these circuits are not discussed.

The current comparator 1 has an inverting input coupled to the drain electrode of the memory cell MC to be sensed through the first current-replicating circuit R1, and a non-inverting input connected to the first variable reference current generator G1. An output signal S1 of the current comparator 1 is supplied to the sequential machine 4. The current comparator 2 has an inverting input coupled to the drain electrode of the memory cell MC to be sensed through the second current-replicating circuit R2, and a non-inverting input connected to the second variable reference current generator G2. An output signal S2 of the current comparator 2 is supplied to the sequential machine 4. The current comparator 3 has an inverting input coupled to the drain electrode of the memory cell MC to be sensed through the third current-replicating circuit R3, and a non-inverting input connected to the third variable reference current generator G3. An output signal S3 of the current comparator 3 is supplied to the sequential machine 4.

The sequential machine 4 is further supplied with a preset signal PR and with a clock signal CK (timing signal), and supplies a group CNT of control signals (in digital format) to the three variable reference current generators G1–G3. The sequential machine 4 also generates a group OUT of output signals which, at the end of the sensing procedure, represents the n-bit code stored in the sensed memory cell MC.

Figure 4:
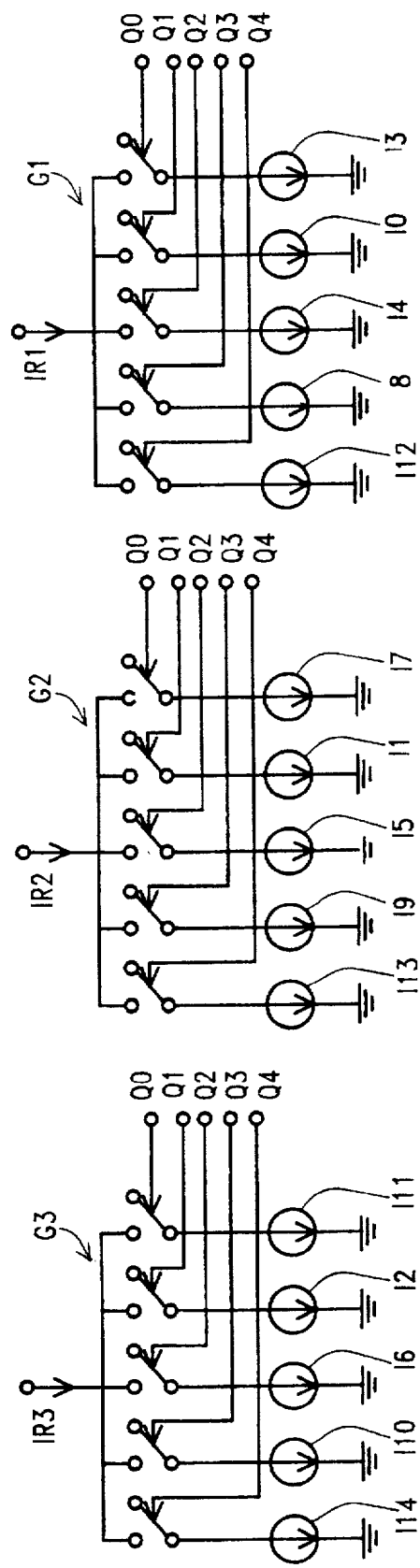
FIG. 4 schematically shows the structure of the variable reference current generators of the sensing circuit of FIG. 3.

In FIG. 4 the structure of the three digitally-driven variable reference current generators G1–G3 is shown in the case of a sensing circuit for a sixteen-level memory cell. Schematically, the reference current generator G1 comprises five parallel-connected current generators with the values I3, I0, I4, I8, I12 shown in FIG. 1, each current generator having in series a respective switch controlled by a respective one of five control signals Q0–Q4 forming the group CNT of control signals supplied by the sequential machine 4. The reference current generator G2 comprises five parallel-connected current generators with the values I7, I1, I5, I9, I13 shown in FIG. 1, each current generator having in series a respective switch controlled by a respective one of the five control signals Q0–Q4. The reference current generator G3 comprises five parallel-connected current generators with the values I11, I2, I6, I10, I14 shown in FIG. 1, each current generator having in series a respective switch controlled by a respective one of the five control signals Q0–Q4. Each one of the five control signals Q0–Q4 controls three switches, one switch for each one of the reference current generators G1–G3.

Each one of the fifteen current generators comprises one reference memory cell, programmed in one of first fifteen levels ("1"–"15" in FIG. 1) of the sixteen distinct programming levels of the memory cell MC to be sensed, so that when the reference memory cells are biased in the same condition of the memory cells to be read they sink a current of the set IC0–IC14. It appears that with this arrangement the currents generated by the variable reference current generators G1–G3 do not have the values I0–I14 shown in FIG. 1. However, as it will be explained later, it is possible to transform the currents IC0–IC14 sunk by the reference memory cells into the current values I0–I14 by making the current comparators 1–3 unbalanced.

In the practical implementation of the sensing circuit in a memory device, wherein the memory cells belong to a memory array in which the memory cells are arranged in columns (bit lines), each one of the fifteen current generators comprises a column of reference memory cells (reference bit line). All the reference memory cells belonging to a reference bit line are programmed at the same programming level. The fifteen reference bit lines are grouped together in three groups of five reference bit lines. Each one of the three groups is coupled to a respective current comparator. The switches provided in series to each one of the current generators are formed by selection transistors, and correspond to the transistors selecting one of the bit lines of the memory array. In this way, the memory cells in the memory array and the reference memory cells are perfectly similar both from the circuital and from the biasing conditions viewpoints.

Figure 5:
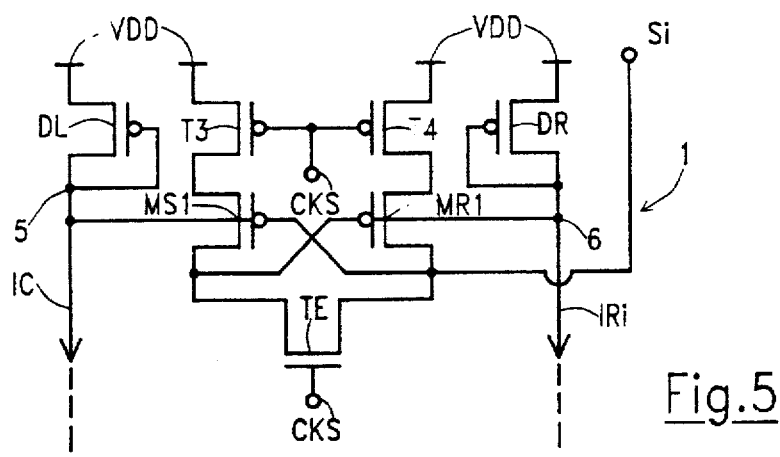
FIG. 5 is a circuit diagram showing the structure of a current comparator of the sensing circuit shown in FIG. 3.

FIG. 5 shows the detailed circuit structure of one of the three current comparators 1–3 of FIG. 3. The circuit comprises two load MOSFETs DL and DR (P-channel type) performing a current/voltage conversion of the memory cell current IC and of the reference current IRi (i=1 to 3), respectively. The drain voltages 5 and 6 of DL and DR control the gates of two cross-connected MOSFETs MS1 and MR1 (P-channel type) forming a latch. The source electrodes of MS1 and MR1 can be connected to a power supply line VDD through two respective P-channel MOSFETs T3 and T4, which are commonly driven by a signal CKS derived from the clock signal CK (CKS can, for example, be the logic complement of CK). The drain electrodes of MS1 and MR1 can be short-circuited to each other by the activation of an N-channel MOSFET TE driven by the signal CKS. The drain electrode of MR1 forms the comparator output Si (i=1 to 3). It should be observed that the characteristics of the current comparators are compatible with the number of different programming levels of the memory cells to be sensed. Specifically, the input sensitivity of the comparators (i.e., the minimum current difference capable of causing the comparator to switch) is lower than the difference between the memory cell currents of two adjacent programming levels.

Since as previously described the variable reference current generators G1–G3 are comprised of reference memory cells programmed in one of the first fifteen different programming states "1"–"15" of the memory cells, and since the reference memory cells are biased in the same conditions as the memory cell to be sensed, the current comparators are unbalanced (i.e., the currents IC and IRi to be compared are supplied to the respective input of the different from 1:1, for example, 1 to 0.7). This is achieved making the MOSFETs MS1 and MR1 different in size, for example, MS1 with an aspect ratio equal to 0.7 times the aspect ratio of MR1. Thanks to this unbalance, even if the reference memory cells sink currents equal to the memory cell currents IC0–IC14, the reference currents I0–I14 previously listed can be obtained.

Figure 6:
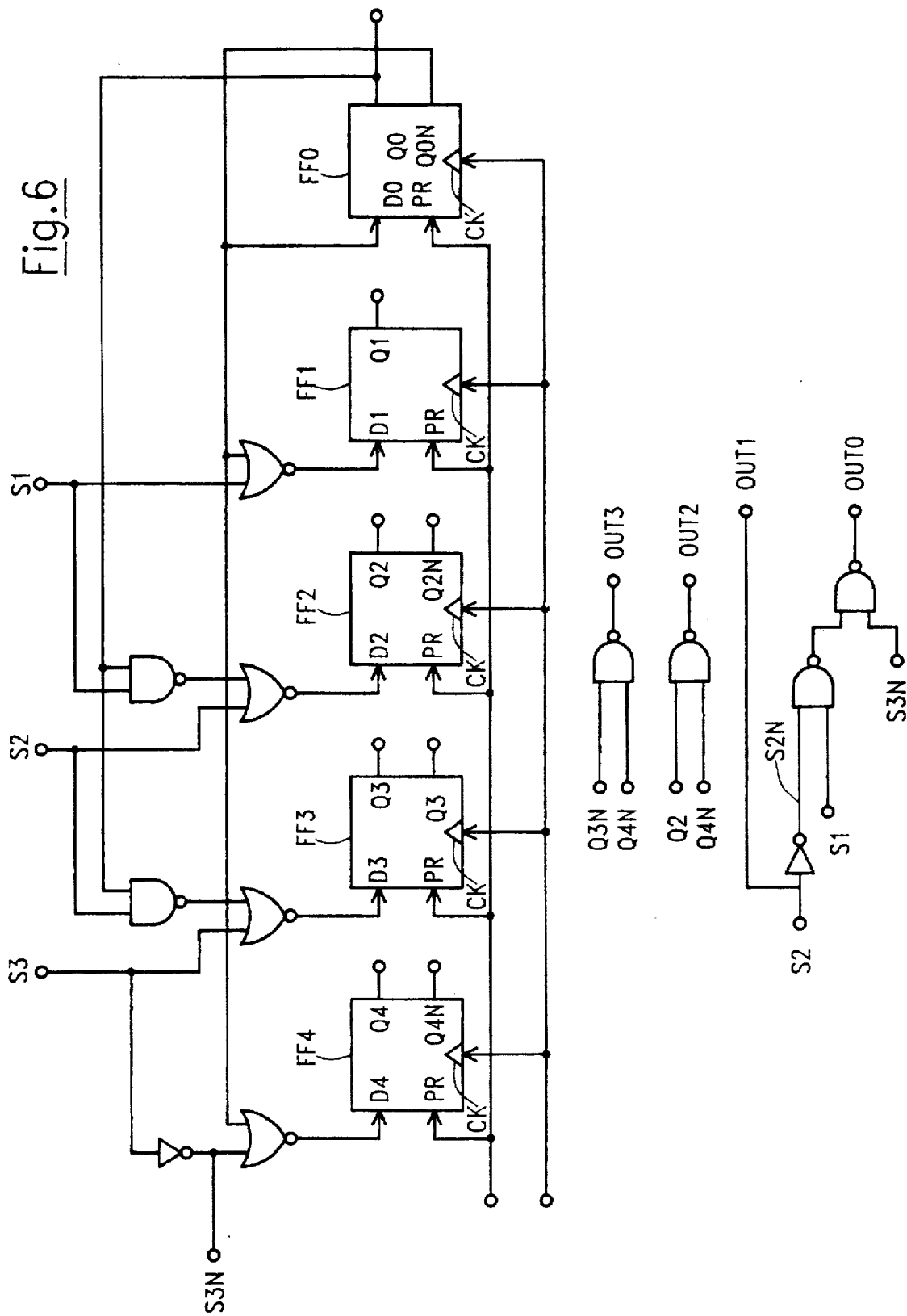
FIG. 6 schematically shows the structure of a sequential machine controlling the variable reference current generators of the sensing circuit.

FIG. 6 shows the structure of the sequential machine 4. The sequential machine 4 must provide the correct sequence of activation of the switches in the variable reference current generators G1–G3, according to the result of the comparisons of the memory cell current IC with the three reference currents IR1–IR2 in the preceding step of the sensing method.

The sequential machine 4 comprises a sequential network comprising five flip-flops FF0–FF4 (delay type) implementing the recursive successive approximation search algorithm and activating in the correct sequence the group CNT of control signals Q0–Q4 controlling the switches in the variable reference current generators G1–G3. The sequential network keeps memory of the preceding state and, depending on the result of the current comparisons during the current step of the sensing algorithm, determines the future state of the five control signals Q0–Q4.

Each flip-flop FF0–FF4 has a clock input CK and a preset input PR. The clock inputs CK and the preset inputs PR of the flip-flops FF0–FF1 are commonly connected to the clock signal CK and to the preset signal PR, respectively. Each flip-flop has a data input D0–D4, a "true" data output Q0–Q4, and a "complemented" data output Q0N–Q4N which is the logic complement of the true data output Q0–Q4. As is known, in a D-type flip-flop the true data output after a clock pulse takes the logic value of the data input during said clock pulse. The true data output Q0–Q4 of the flip-flops forms the five control signals of the group CNT controlling the switches in the variable reference current generators G1–G3.

The data input D0 of FF0 is supplied with the complemented data output Q0N of FF0. The data input D1 of FF1 is supplied with the logic NOR of Q0N and of the output S1 of the first current comparator 1. The data input D2 of FF2 is supplied with a logic signal equal to NOT(S2 OR NOT(S1 AND Q0)), where S2 is the output of the second current comparator 2. The data input of FF3 is supplied with a logic signal equal to NOT(S3 OR NOT(S2 AND Q0)), where S3 is the output of the third current comparator 3. The data input D4 of FF4 is supplied with a logic signal equal to the logic NOR of Q0 and of the logic complement S3N of S3.

The sequential machine 4 also comprises a combinatorial network, also shown in FIG. 6, which generates the output signals OUT0–OUT3 representing the four-bit code stored in the sensed memory cells. The signal OUT0 is equal to NOT(S3N AND NOT(S1 AND S2N)), where S2N is the logic complement of S2. The signal OUT1 is equal to S2. The signal OUT2 is equal to NOT(Q2 AND Q4N). The signal OUT3 is equal to NOT(Q3N AND Q4N). The logic state of the output signals OUT0–OUT3 depends on the present state of the sequential machine, i.e., on the present state of the signals Q0–Q4, and on the output signals S1–S3 of the current comparators 1–3 in the last step of the sensing algorithm. Thank to this, the output signals OUT0–OUT3 are already available after one and a half clock cycles, in the first half of the second period of the clock signal CK (FIG. 9).

FIG. 7 is a truth table of the sequential machine of FIG. 6.

The preset signal PR is used at the circuit power-up to assure that the starting condition of the flip-flops FF0–FF4 is that corresponding to Q0=1 and Q1=Q2=Q3=Q4=0. In this condition, IR1=I3, IR2=I7 and IR3=I11. The preset of the sequential machine must be performed only once (at the circuit power up) because, as it appears from the truth table of FIG. 7 and from the state-transition diagram shown in FIG. 8, the sequential machine automatically sets in the starting condition Q0=1, Q1–Q4=0 at the end of the second clock period.

Figure 8:
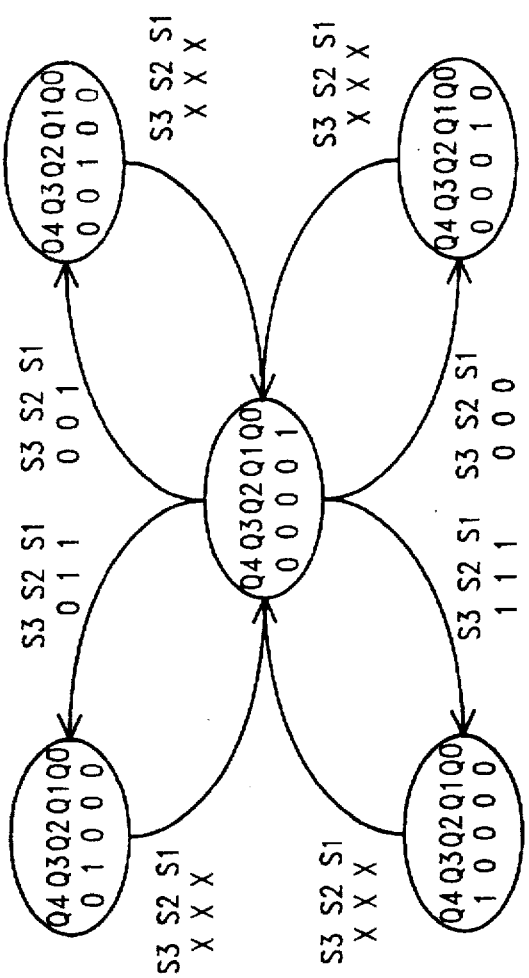
FIG. 8 is a state-transition diagram of the sequential machine of FIG. 6.

The operation of the sensing circuit will be now described making reference to the truth-table of FIG. 7, to the state-transition diagram of FIG. 8 and to the time diagram of FIG. 9. As previously described in connection with FIG. 2, according to the sensing method of the present invention the sensing of a sixteen-level memory cell MC is carried out in two steps. By way of example, it is assumed that the programming level of the memory cell to be sensed corresponds to a cell current IC=IC6. At the beginning of the first step ($t_0$ in FIG. 9) Q0=1 and Q1–Q4=0, so that IR1=I3, IR2=I7 and IR3=I11. On the rising edge of the clock signal CK the three comparators 1–3 simultaneously compare the cell current IC with the three reference currents IR1–IR3. The result of the comparisons is: S1=1, S2=0 and S3=0. On the falling edge of the clock signal CK, the logic state of Q0–Q4 changes to Q0=Q1=0, Q2=1 and Q3=Q4=0. IC is thus compared with IR1=I4, IR2=I5 and IR3=I6. On the rising edge of the clock signal CK the three comparators 1–3 simultaneously compare the cell current IC with the three reference currents IR1–IR3. The result of the comparison is S1=S2=1 and S3=0, and the output signals OUT of the sequential machine 4 assume the logic state OUT0=0, OUT1=OUT2=1 and OUT3=0, that is the four-bit code stored in the memory cell MC. The valid output data OUT0–OUT3 are at $t_0$ +(3/2 T) (where T is the period of the clock signal CK), i.e., before the end of the second clock pulse. On the next falling edge of the clock signal CK, the flip-flops FF0–FF4 are automatically preset to the state Q0=1, Q2–Q4=0 (self-preset), and the circuit is ready to perform a new sensing.

The sensing method of the present invention represents a better trade-off between the sensing time and the complexity of the sensing circuit with respect to the dichotomic serial sensing method and the parallel sensing method: the time required to sense a memory cell is lower than that required by the dichotomic serial sensing method, and the sensing circuit is less complex (less silicon area) than that required by the parallel sensing method.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A method for reading a memory cell that stores one of a possible three or more data values, the method comprising:

activating said cell to provide a current equal to one of a possible three or more current levels that corresponds to said stored data value, each of said current levels corresponding to a different one of said data values;

substantially simultaneously comparing said current from said cell with a first plurality of reference currents that are each between a lowest and a highest of said current levels, said reference currents defining groups of said current levels;

determining to which group of current levels said current belongs;

substantially simultaneously comparing said current from said cell with a second plurality of reference currents that are each between a lowest and a highest of those of said current levels that are within said determined group, said second plurality of reference currents defining subgroups of those of said current levels that are within said determined group; and determining to which subgroup of current levels said current belongs.

2. The method of claim 1, further comprising:

continuing comparing said current from said cell and determining to which subgroup said current belongs until said subgroup to which said current belongs includes only one current level; and equating said stored data value with the data value corresponding to said only one current level.

3. The method of claim 1 wherein said determining to which group said current belongs comprises determining at least the most significant bit of said stored data value.

4. A circuit for reading a memory cell that stores one of a possible sixteen or more data values, the circuit comprising:

an input terminal that is operable to receive a data current from said memory cell;

an output terminal;

three current mirrors coupled to said input terminal;

a sequential machine having a control input, a control output, and a data output that is coupled to said output terminal, said sequential machine operable to generate at said data output a digital signal that corresponds to said stored data value, said sequential machine operable to generate a control signal at said control output;

three comparators each having a first input terminal coupled to a corresponding one of said current mirrors, a second input terminal, and an output terminal coupled to said control input of said sequential machine; and three variable-reference-current generators each having an output coupled to said second input terminal of a corresponding one of said comparators and each having a control input coupled to said control output of said sequential machine.

5. The circuit of claim 4 wherein said sequential machine comprises a clock input.

6. The circuit of claim 4 wherein said sequential machine comprises a clock input and a preset input.

7. Method for sensing multiple-levels non-volatile memory cells which can take one programming level among a plurality of m=$2^n$ (n>=2) different programming levels, providing for biasing a memory cell to be sensed in a predetermined condition, so that the memory cell sinks a cell current with a value belonging to a discrete set of m distinct cell current values, each cell current value corresponding to one of said programming levels, characterized by further providing for:

(a) simultaneously comparing the cell current with a prescribed number of reference currents having values comprised between a minimum value and a maximum value of said discrete set of m cell current values and dividing said discrete set of m cell current values in a plurality of sub-sets of cell current values, for determining the sub-set of cell current values to which the cell current belongs; and (b) repeating step (a) for the sub-set of cell current values to which the cell current belongs, until the sub-set of cell current values to which the cell current belongs comprises only one cell current value, which is the value of the current of the memory cell to be sensed.

8. Method according to claim 7, characterized in that at each repetition of step (a) a group k of bits of an n-bit digital code stored in the memory cell to be sensed are determined.

9. Method according to claim 7, characterized in that said reference currents have values suitable to divide said discrete set of m cell current values in sub-sets containing an equal number of cell current values.

10. Method according to claim 9, characterized in that said reference currents have values which are intermediate between pairs of adjacent cell current values.

11. Method according to claim 7 for sensing a sixteen-level non-volatile memory cell, providing for:
(a) simultaneously comparing the cell current with three reference currents dividing the discrete set of sixteen cell current values in four sub-sets of cell current values each sub-set containing four cell current values, for determining the sub-set of cell current values to which the cell current belongs; and
(b) simultaneously comparing the cell current with three different reference currents, a first reference current being comprised between the first two cell current values of the sub-set to which the cell current belongs, a second reference current being comprised between the second and the third cell current values of the sub-set to which the cell current belongs, and a third reference current being comprised between the third and the fourth cell current values of the sub-set to which the cell current belongs, for determining the cell current of the memory cell to be sensed.

12. Circuit for sensing multiple-level non-volatile memory cells which can take one programming level among a plurality of $m=2^n$ ($n>=2$) different programming levels, comprising biasing means for biasing a memory cell to be sensed in a predetermined condition, so that the memory cell sinks a cell current with a value belonging to a discrete set of m distinct cell current values, each cell current value corresponding to one of said programming levels, characterized in that it comprises a plurality of current comparators for simultaneously comparing the cell current with a plurality of reference currents generated by a plurality of variable reference current generators, and in that it further comprises a sequential machine supplied with output signals of said plurality of current comparators and controlling the variable reference current generator, the sequential machine comprising a sequential network which, starting from a predetermined initial state causing the reference current generators to generate a plurality of reference currents with value comprised between a minimum value and a maximum value of said discrete set of cell current values and dividing said discrete set of m cell current values in a plurality of sub-sets of cell current values, evolves through a succession of states each one determined by the preceding state and by the logic state of said output signals of the current comparators, each state of the sequential network causing the reference current generators to generate reference currents with values comprised between a minimum value and a maximum value of the sub-set of cell current values to which the cell current belongs and further dividing said sub-set of cell current values in a plurality of sub-sets of cell current values.

13. Circuit according to claim 12, characterized in that said plurality of current comparators comprises k−1 current comparators, being k a group of bits of an n-bit digital code stored in the memory cell to be sensed which are determined by simultaneously comparing the cell current with the reference currents.

14. Circuit according to claim 13, characterized in that each variable reference current generator comprises a plurality of distinct current generators, each state of the sequential network determining the activation of a respective one of the distinct current generators in each variable reference current generators.

15. Circuit according to claim 11, characterized in that each current generator of said plurality of distinct current generators comprises a reference memory cell with a predetermined programming level and biased in a predetermined biasing condition.

16. Circuit according to claim 15, characterized in that each current generator of said plurality of distinct current generators comprises a plurality of parallely connected reference memory cells with the same programming levels, each one of said plurality of reference memory cells being biased in said predetermined biasing condition when a respective memory cell is to be sensed.

17. Circuit according to claim 10, characterized in that the sequential machine further comprises a combinatorial network which is supplied with signals identifying the state of the sequential network and with the output signals of the current comparators, and provides n output digital signals carrying the digital code stored in the memory cell to be sensed.

18. Circuit according to claim 17, characterized in that said sequential network automatically presets to said initial state after the sensing of a memory cell has been completed.

* * * * *